(12) United States Patent
Menon et al.

(10) Patent No.: US 10,900,907 B2
(45) Date of Patent: Jan. 26, 2021

(54) PORTABLE PLASMA SOURCE FOR OPTICAL SPECTROSCOPY

(71) Applicant: Radom Corporation, West Allis, WI (US)

(72) Inventors: Ashok Menon, Shorewood, WI (US); Velibor Pikelja, Milwaukee, WI (US); Jovan Jevtic, West Allis, WI (US)

(73) Assignee: Radom Corporation, West Allis, WI (US)

(*) Notice: Subject to any disclaimer, the term of this patent is extended or adjusted under 35 U.S.C. 154(b) by 0 days.

(21) Appl. No.: 15/897,684

(22) Filed: Feb. 15, 2018

(65) Prior Publication Data

US 2018/0238807 A1 Aug. 23, 2018

Related U.S. Application Data

(60) Provisional application No. 62/460,382, filed on Feb. 17, 2017.

(51) Int. Cl.
*G01N 21/73* (2006.01)
*H01J 37/32* (2006.01)
*G01J 3/02* (2006.01)
*G01J 3/443* (2006.01)
*H01J 37/244* (2006.01)
*H01J 49/04* (2006.01)
*H01J 49/10* (2006.01)

(52) U.S. Cl.
CPC ............ *G01N 21/73* (2013.01); *G01J 3/0208* (2013.01); *G01J 3/443* (2013.01); *H01J 37/244* (2013.01); *H01J 37/32201* (2013.01); *H01J 37/32247* (2013.01); *H01J 37/32449* (2013.01); *H01J 49/0404* (2013.01); *H01J 49/105* (2013.01); *G01N 2201/0221* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,265,717 B1 * | 7/2001 | Sakata | ................... | H01J 49/067 250/281 |
| 6,429,935 B1 * | 8/2002 | Duan | ..................... | G01N 21/73 356/316 |
| 9,218,944 B2 * | 12/2015 | Chandrachood | ........ | C23C 16/52 |
| 9,714,864 B2 * | 7/2017 | Day | ........................ | G01J 3/443 |
| 10,209,196 B2 * | 2/2019 | Day | ........................ | G01N 33/18 |
| 10,285,256 B2 * | 5/2019 | Jevtic | ....................... | H05H 1/46 |
| 10,322,384 B2 * | 6/2019 | Stumpf | ................. | B01F 5/0651 |
| 10,436,717 B2 * | 10/2019 | Omstead | ................ | G01N 21/73 |
| 10,473,525 B2 * | 11/2019 | Meng | ...................... | G01N 21/31 |

(Continued)

FOREIGN PATENT DOCUMENTS

| | | |
|---|---|---|
| JP | H06146026 A | 5/1994 |
| JP | 2003273615 | 9/2003 |

(Continued)

*Primary Examiner* — Mohamed K Amara
(74) *Attorney, Agent, or Firm* — Boyie Fredrickson, S.C.

(57) ABSTRACT

A portable, modular plasma source allows the production of an emission spectrometer by combination with a common portable fiber optic spectrograph by channeling emitted light through a fiber optic coupling communicating light from the plasma source to the portable fiber optic spectrograph.

12 Claims, 2 Drawing Sheets

(56) References Cited

U.S. PATENT DOCUMENTS

| | | | |
|---|---|---|---|
| 2002/0135761 A1* | 9/2002 | Powell | G01J 3/02 356/316 |
| 2002/0187066 A1* | 12/2002 | Yu | A61L 2/0011 422/22 |
| 2003/0086840 A1 | 5/2003 | Himori et al. | |
| 2003/0160956 A1 | 8/2003 | Chevalier | |
| 2003/0174325 A1* | 9/2003 | Zhang | G01J 3/443 356/318 |
| 2006/0137613 A1 | 6/2006 | Kasai | |
| 2008/0144164 A1* | 6/2008 | Metivier | H01S 3/06754 359/341.32 |
| 2009/0045749 A1 | 2/2009 | Ganachev et al. | |
| 2009/0139657 A1* | 6/2009 | Lee | H01J 37/32357 156/345.24 |
| 2010/0096544 A1* | 4/2010 | Slivon | H01J 49/0022 250/282 |
| 2010/0206482 A1* | 8/2010 | Matsudo | G01J 5/0003 156/345.27 |
| 2010/0320379 A1 | 12/2010 | Morrisroe | |
| 2011/0000780 A1 | 1/2011 | Tian et al. | |
| 2011/0005940 A1* | 1/2011 | Pierce | B22F 3/003 205/687 |
| 2013/0141720 A1* | 6/2013 | Park | G01J 3/443 356/316 |
| 2015/0132711 A1* | 5/2015 | Mason | H05H 1/2406 433/80 |
| 2015/0138545 A1* | 5/2015 | Day | G01J 3/0272 356/318 |
| 2016/0025656 A1* | 1/2016 | Jevtic | H05H 1/46 324/633 |
| 2016/0029472 A1* | 1/2016 | Jevtic | H05H 1/46 250/288 |
| 2016/0088868 A1* | 3/2016 | Dobrinsky | A23L 3/28 250/492.1 |
| 2016/0146668 A1* | 5/2016 | Hatahori | G01J 3/0218 356/301 |
| 2016/0314943 A1* | 10/2016 | Albarede | H01J 37/32082 |
| 2017/0027051 A1* | 1/2017 | Jevtic | H05H 1/46 |
| 2017/0362712 A1* | 12/2017 | Yadav | C23C 16/52 |

FOREIGN PATENT DOCUMENTS

| | | |
|---|---|---|
| JP | 2005251546 A | 9/2005 |
| JP | 2006185923 A | 7/2006 |
| JP | 2009272127 A | 11/2009 |
| JP | 2011232106 A | 11/2011 |
| JP | 2012104424 A | 5/2012 |
| WO | 03096769 A1 | 11/2003 |

* cited by examiner

PORTABLE PLASMA SOURCE FOR OPTICAL SPECTROSCOPY

CROSS REFERENCE TO RELATED APPLICATION

This application claims the benefit of U.S. provisional application 62/460,382 filed Feb. 17, 2017, and hereby incorporated by reference.

STATEMENT REGARDING FEDERALLY SPONSORED RESEARCH OR DEVELOPMENT

Not Applicable

BACKGROUND OF THE INVENTION

The present invention relates to optical spectroscopy and in particular to a portable plasma source for use with emission spectroscopy.

Emission spectroscopy analyzes the light frequencies produced by heated elements or compounds resulting from atoms or molecules making a transition from higher to lower energy states. Inductively coupled plasma atomic emission spectroscopy is a type of emission spectroscopy that uses a plasma to heat the materials being analyzed. The plasma, in this case, is produced by the inductive electrical coupling of energy to a gas such as argon.

Spectroscopes employing inductively coupled plasma may provide a sample feeding mechanism such as a pump and atomizer producing an aerosolized analyte material carried by argon to the vicinity of an inductive loop that creates a plasma. The plasma heats the analyte promoting light emissions received by an optical system (spectroscope assembly) that resolves the different frequencies of the light to output a desired emission spectrograph indicating light amplitude as a function of frequency over a range of frequencies.

Commercial inductively coupled plasma emission spectroscopes weigh many hundreds of pounds and require substantial bench top space substantially limiting their use in many important applications including those that would benefit from rapid analysis at locations remote to the laboratory.

SUMMARY OF THE INVENTION

The present invention provides a lightweight, modular plasma source that collimates light emissions into a fiber optic link allowing an emission spectrometer to be constructed using the modular plasma source with any a general purpose fiber optic spectrometer. This results in a low-cost, portable device greatly increasing the availability of this research tool to applications outside of a normal laboratory environment.

Specifically, in one embodiment, the invention provides a modular plasma source having a housing with a base on which the housing may be supported. The housing in turn supports each of an electronically controllable plasma generator, a sample handling system for introducing a sample into plasma generated by the plasma generator, and an optical collimation system capturing light from the plasma heated sample. A fiber optic connector receives collimated light from the optical collimation system and couples that light to an optical fiber releasably attached to the fiber optic connector and adapted to communicate with an external portable spectrometer.

It is thus a feature of at least one embodiment of the invention to disaggregate the components of an emission spectrometer to take advantage of low-cost fiber optic spectrographs. It is another feature of at least one embodiment of the invention to collimate light to a fiber optic to permit ready connection of the modular plasma source to such low-cost fiber optic spectroscopes.

The modular plasma source may have a weight of less than 50 pounds and the housing may have a lower horizontal surface adapted to be supported by a bench or the like and fitting within an area of less than four square feet.

It is thus a feature of at least one embodiment of the invention to provide a unit whose components can be readily transported by an individual to provide a portable emission spectrograph increasing the accessibility of this laboratory instrument.

The plasma generator may provide an annular ring of dielectric material concentric about an axis and generating plasma along the axis.

It is thus a feature of at least one embodiment of the invention to make use of a dielectric resonator plasma source permitting compact generation of plasma with low input wattages suitable for a portable device.

The axis of the dielectric material may be vertical in the normal orientation of the housing supported by the base.

It is thus a feature of at least one embodiment of the invention to reduce the footprint of the plasma source by providing a vertical transport of the sample in the plasma.

The optical collimation system may receive light along the axis.

It is thus a feature of at least one embodiment of the invention to simplify the shielding of the plasma and to increase light collection by collecting light along the plasma axis.

The modular plasma source may further include an air knife positioned along the axis between the annular ring dielectric and the optical collimation system.

It is thus a feature of at least one embodiment of the invention to permit axial collection of emission light without damage to the optical collection system by the plasma heat.

The optical collimation system may include a mirror which in one embodiment may be an ultraviolet-enhanced aluminum parabolic mirror.

It is thus a feature of at least one embodiment of the invention to displace collimation lenses further from the heat directed along the axis through the use of an optical path-bending mirror.

The modular plasma source may include a power supply receiving line power and communicating with a microwave generator inductively coupled to the annular ring to excite the annular ring into resonance.

It is thus a feature of at least one embodiment of the invention to provide an extremely energy-efficient plasma source conducive to portable operation.

The housing may include a handle on the top of the housing opposite the base for lifting the housing by the use of the handle by an individual.

It is thus a feature of at least one embodiment of the invention to separate the components of an emission spectrograph to modules suitable for individual transportation.

The modular plasma source may further include inlet connectors attached to the housing for receiving argon and nitrogen to be conducted to the plasma generator.

It is thus a feature of at least one embodiment of the invention to separate the gas source from the modular plasma source for improved portability and versatility.

The housing may provide a horizontal bench positioned beneath an overhang portion, wherein the sample-handling system is exposed for access between the bench portion and the overhang and wherein the overhang portion describes an internal volume holding the electronically controllable plasma generator and optical collimation system and having a connector for communicating with an exhaust duct.

It is thus a feature of at least one embodiment of the invention to provide a miniature bench and sample preparation area for environments where such surfaces are not readily available.

The fiber optic connector may be an SMA-905 optical connector.

It is thus a feature of at least one embodiment of the invention to provide a standard connector allowing a wide range of different spectrographs to be employed.

These particular objects and advantages may apply to only some embodiments falling within the claims and thus do not define the scope of the invention.

DETAILED DESCRIPTION OF THE PREFERRED EMBODIMENT

Figure 1:
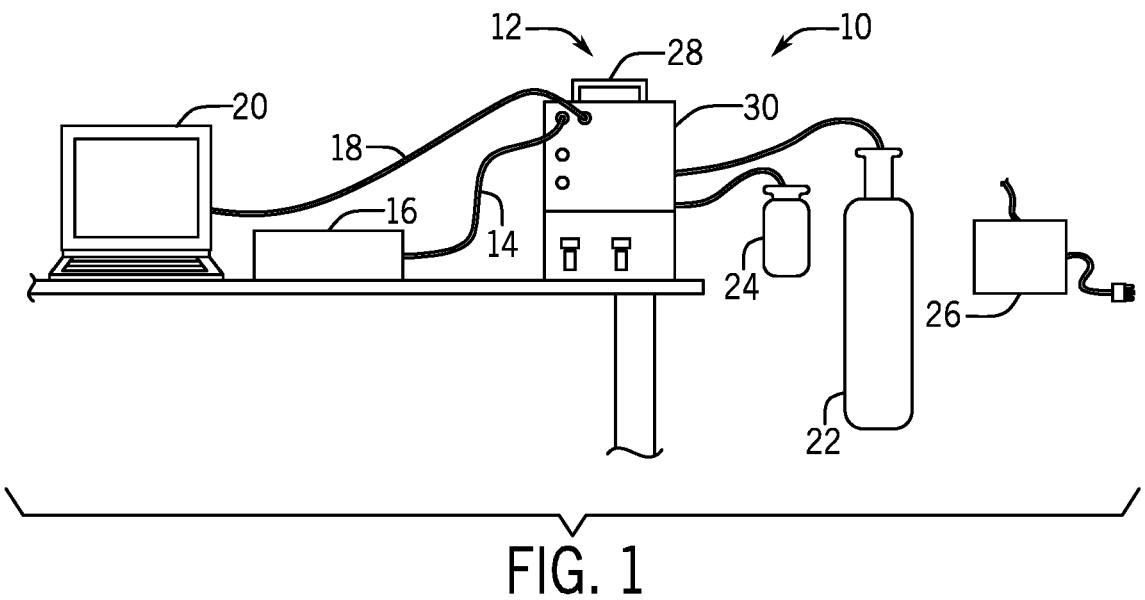
FIG. 1 is an interconnection diagram of the portable plasma source of the present invention, for example, as connected to a portable spectroscope, laptop computer and different gas sources.

Referring now to FIG. 1, an inductively coupled plasma emission spectroscope system 10 may employ a portable plasma source 12 coupled by an optical fiber 14 to a portable fiber optic spectrometer 16 and coupled by means of a USB cable 18 to a laptop computer 20 or the like.

As will be discussed further below, the portable plasma source 12 may receive an external source of nitrogen, for example, held under compression within a nitrogen tank 22 as well as a source of argon in a smaller tank 24. Alternatively, the source of nitrogen may be replaced with a standard electric air pump 26 providing compressed, filtered air having significant nitrogen content.

The present invention provides a portable plasma source 12 having a weight less than 50 pounds such as may be lifted and carried by a single handle 28 centered on the top of a housing 30 and may fit within an area of four square feet on a bench top or the like.

Figure 2:
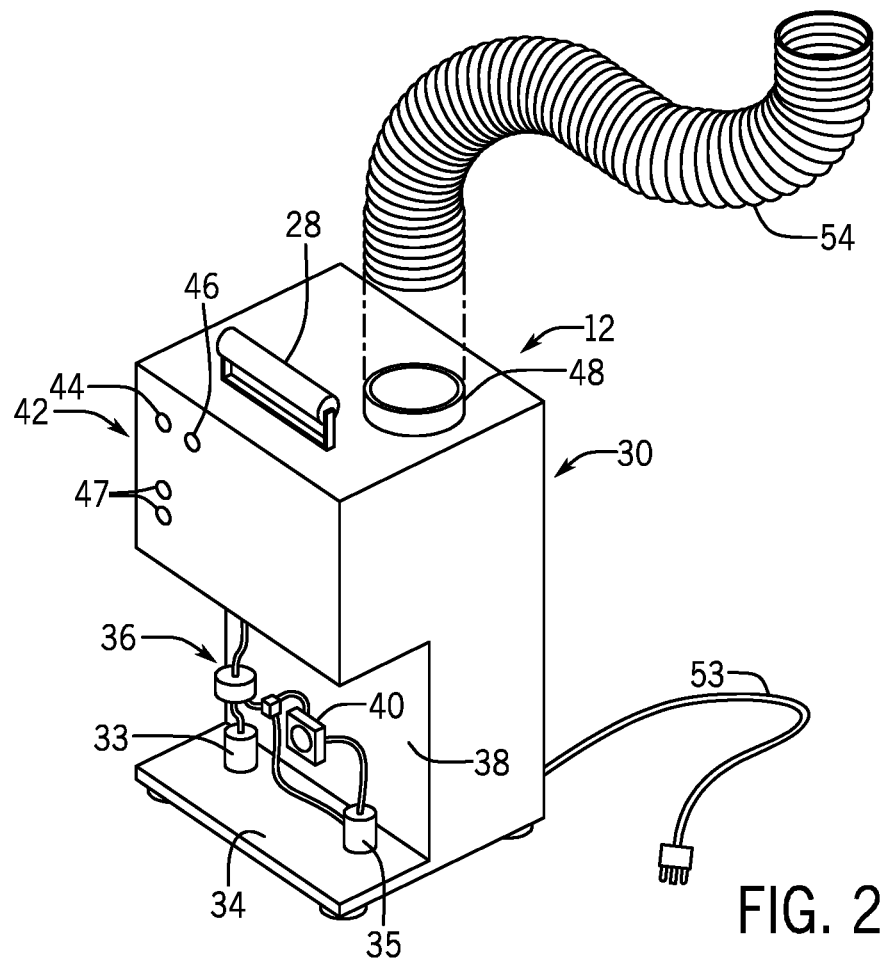
FIG. 2 is a perspective view of the portable plasma source of FIG. 1 showing an integrated sample bench.

Referring also to FIG. 2, a housing 30 of the portable plasma source 12 may provide for an integrated sample bench 34 for supporting a sample vessel 35 of the material being analyzed and a waste container 33. A vertical wall 38 of the housing 30, behind the sample bench 34 may hold an electrically controlled pump 40 providing an analyte pumped from the sample vessel 35 and provided to atomizer assembly 36. An output of the atomizer assembly 36 is directed upward to the lower surface of an overhang portion 42 of the housing 30 holding a contained plasma source. The vertical wall 38 may also provide for releasable gas line connectors allowing access to the gas flow from internal gas 52a-52d as will be discussed below.

A front panel of the housing 30 of the overhang portion 42 may provide for a USB connector 44, a fiber optic connector 46 and start and stop buttons 47. An upper wall of the housing 30 provides an exhaust tube 48 that may be connected to a fume hood by conduit 54. A power cord 53 provides a connection to a standard wall outlet.

Figure 3:
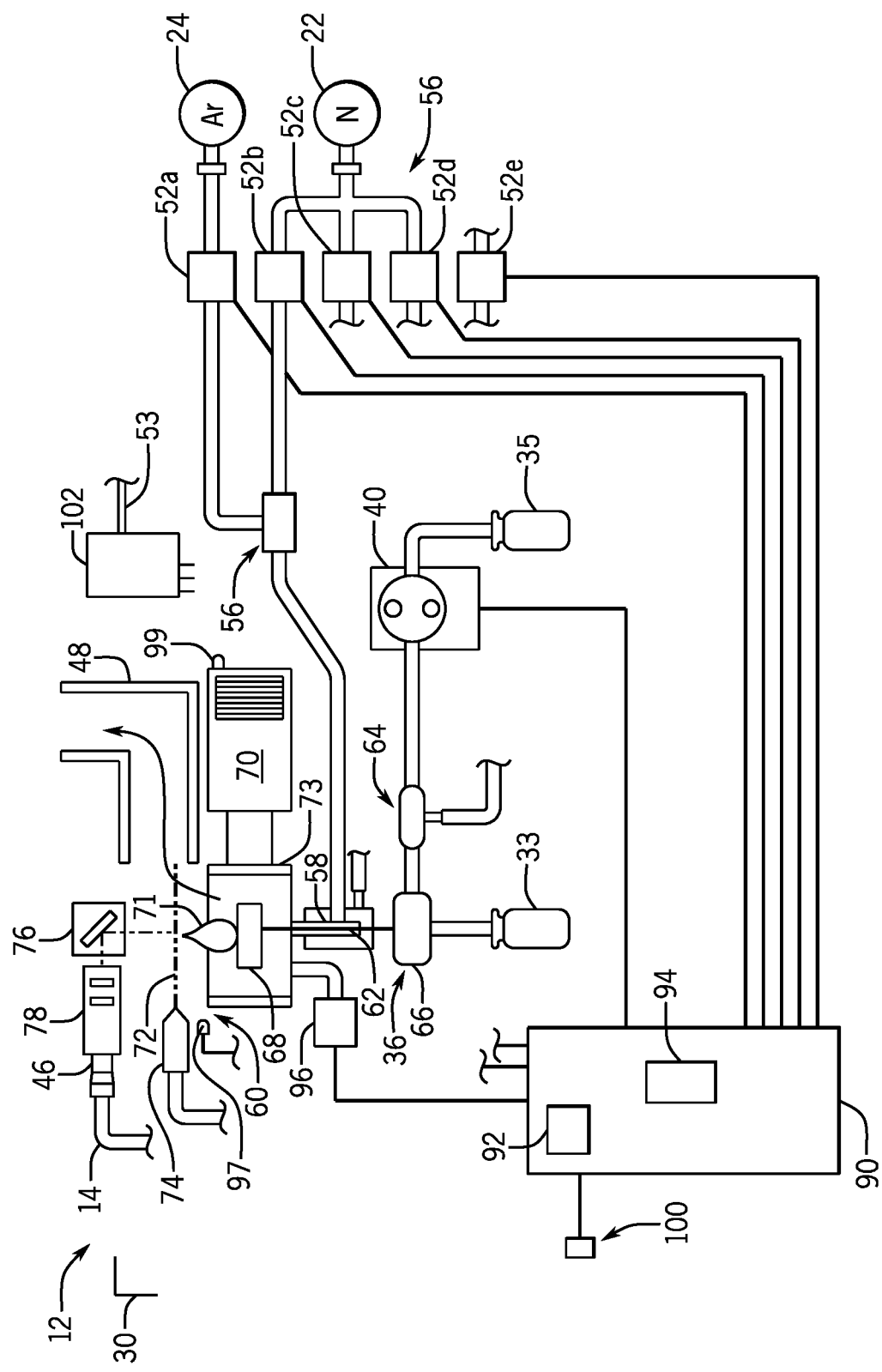
FIG. 3 is a block diagram of the components of the portable plasma source of FIG. 1.

Referring now to FIG. 3, argon from argon tank 24 and nitrogen from nitrogen tank 22 may be received by gas control valves 52a-52e within the housing 30, with gas control valve 52a connected to the argon tank 24 and gas control valves 52b-52d each connected to the nitrogen tank 22, the latter by means of a three-way manifold. Gas control valve 52e may receive compressed air or other gas for use with an air knife as will be discussed below. Gas control valves 52b-52d may be mass flow controllers allowing precise control of mass flow.

The output from gas control valves 52a and 52b may lead to a T-combiner 56 that will allow the introduction of argon for initiating plasma and then a switch over to nitrogen as will be discussed. The output of the combiner 56 may attach to a carrier jet tube 58 directing argon or nitrogen upward into a plasma generation region 60 as will be discussed below. The output of valve 52c may provide for a cooling gas stream received by a collar around the carrier jet tube 58 for additional cooling.

Concentrically centered within the carrier jet tube 58 is a quartz or alumina torch 62, being a tube that receives and then introduces an atomized form of the analyte obtained from atomizer assembly 36 into the plasma generation region 60. This atomizer assembly 36 may include an atomizer 64 receiving pumped analyte from sample vessel 35 through pump 40 and nitrogen under pressure from gas control valve 52d to atomize the analyte for introduction into a vortex separator 66. The vortex separator 66 passes only the finest suspended analyte particles up into the quartz torch 62 and diverts the larger particles centrifugally downward into the waste container 33.

Positioned within the plasma generation region 60 is a dielectric doughnut 68 inductively coupled to a microwave source 70, for example, a magnetron operating at 1000 to 1500 watts. The dielectric doughnut 68 may be of a type described in U.S. Pat. No. 9,491,841 assigned to the assignees of the present invention and hereby incorporated by reference and held within a radiofrequency cavity/shield for coupling to microwave energy.

A plasma flame 71 directed upwardly from the radiofrequency cavity/shield 73 is terminated by a horizontal air plume 72 from air knife 74 fed from gas control valve 52e. Exhaust gases are directed out of exhaust pipe 48 while the light from the plasma flame 71 continues upward through the air plume 72 to be received by mirror assembly 76. In this regard the horizontal air plume 72 protects the mirror assembly 76 from heat and reactive gases.

Light received by the mirror assembly 76 is directed to an optical coupling 78 collimating light from the plasma flame 71 into a releasable fiber optic coupling 46 to be transmitted along optical fiber 14 to the fiber optic spectrometer 16 described above. The mirror assembly 76 may include an ultraviolet-enhanced aluminum parabolic mirror and the optical coupling 78 may include fused-silica collimating lenses. The fiber optic coupling 46 may be, for example, an SMA-905 optical connector compatible with a wide variety of different types of optical fibers and fiber optic spectrometers 16.

A control board 90, for example, including a processor 92 and a memory 94 holding a stored program may control each of the gas control valves 52a-52e which provide valving action and control of mass flow, the pump 40, the microwave source 70, and an igniter 96 providing a high-voltage spark to initiate ionization of the gas exiting from the carrier jet tube 58. Alternatively, the igniter 96 may provide an electrical spark directly in the output gas flow of the T-combiner 56. A photosensor 97 communicating with the controller 90 may be provided to detect the existence of the plasma, and a similar photosensor 99 may be positioned proximate to the microwave source 70 for the detection of magnetron arcing to shut down the system.

The controller 90 may provide for basic control functionality but may communicate, for example, through a standard communication interface 100 such as a USB port 44, Bluetooth connection or the like to an external computer 20 including a laptop, tablet, smart phone or the like greatly reducing the weight of the system by allowing external computational and display functionality for computing and displaying a spectrograph as well as controlling the plasma source 12. It will be appreciated that other communication interface 100 may alternatively provide cellular telephone, Wi-Fi or the like, permitting the use of the system 10 for remote monitoring stations (such as river pollution monitoring stations). In this respect the present invention has a substantial advantage in being able to use atmospheric nitrogen and being modular and of low power.

An onboard power supply 102 may provide power to the microwave source 70 controller 90 and other electrical components using power received through a standard line cord requiring 15-ampere or less service.

By modularizing the plasma source 12 through the interface 100 and fiber optic interface 46, and through the use of high-efficiency dielectric plasma generation, portability may be provided in an induced plasma spectroscopy system.

A portable fiber optic spectrometer 16 suitable for use with the present invention is commercially available from Catalina Scientific having offices in Tucson, Ariz., and manufactured under the tradename EMU-120/65/UV/VIS-NIR. A suitable spectrometer 16 may provide a spectral range of 190-850 nm with a resolution of 3.7 pm at 253 nm and may use a back illuminated EMCCD camera and, importantly, the spectrometer 16 should have a sensitivity of at least between 192 nm and 460 nm. For rare earths unique to this invention, the range of interest is approximately 350-550 nm. Resolution greater than 50 pm is not favored, 10-20 pm is acceptable, and below 10 pm is the preferred. Ideally the camera incorporated with the portable fiber optic spectrometer 16 should have a Peltier cooled sensor being of any of CCD, EMCCD, or CMOS type. Spectrometers could be of Echelle type (2D simultaneous type) or conventional with 1D sensor array providing one line or a range of wavelengths at a time.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A modular plasma source for plasma emission spectroscopy comprising:
    a housing having a base on which the housing may be supported, the housing in turn supporting:
    an electronically controllable plasma generator;
    a tube for introducing a sample and carrier gas into plasma generated by the plasma generator;
    an optical collimation lens capturing light from the plasma heated sample; and
    a fiber optic connector receiving collimated light from the optical collimation lens and coupling that light to an optical fiber releasably attached to the fiber optic connector and adapted to communicate with an external portable spectrometer;
    wherein the plasma generator provides an annular ring of dielectric material concentric about an axis and generating plasma along the axis;
    wherein the optical collimation lens collects light extracted from the annular ring along the axis; and
    further including an air knife positioned along the axis between the annular ring dielectric and the optical collimation lens to direct a plume of cool gas, other than the carrier gas received by the plasma, across the axis.

2. The modular plasma source of claim 1 wherein the modular plasma source has a weight of less than 50 pounds.

3. The modular plasma source of claim 2 wherein the housing has a lower horizontal surface adapted to be supported by a bench or the like and fitting within an area of less than tour square feet.

4. The modular plasma source of claim 1 wherein the axis is a vertical orientation of the housing supported by the base.

5. The modular plasma source of claim 1 further including a power supply receiving line power and communicating with a microwave generator inductively coupled to the annular ring to excite the annular ring into resonance.

6. The modular plasma source of claim 1 wherein the housing includes a handle on the top of the housing opposite the base for lifting the housing by the use of the handle by an individual.

7. The modular plasma source of claim 1 further including inlet connectors attached to the housing for receiving argon and nitrogen to be conducted to the plasma generator.

8. The modular plasma source of claim 1 wherein the housing provides a horizontal bench positioned beneath an overhang portion, wherein the sample handling system is exposed for access between the bench portion and the overhang and wherein the overhang portion describes an internal volume holding the electronically controllable plasma generator and optical collimation lens and having a connector for communicating with an exhaust duct.

9. The modular plasma source of claim 1 wherein the fiber optic connector is an SMA-905 optical connector.

10. The modular plasma source of claim 1 further including a portable fiber optic spectrometer having a sensitivity from 190-850 nanometers communicating via the fiber optic with the releasable fiber optic connector.

11. A modular plasma source for plasma emission spectroscopy comprising:
   a housing having a base on which the housing may be supported, the housing in turn supporting:
   an electronically controllable plasma generator;
   a tube for introducing a sample into plasma generated by the plasma generator;
   an optical collimation lens capturing light from the plasma heated sample; and
   a fiber optic connector receiving collimated light from the optical collimation lens and coupling that light to an optical fiber releasably attached to the fiber optic connector and adapted to communicate with an external portable spectrometer;
   wherein the plasma generator provides an annular ring of dielectric material concentric about an axis and generating plasma along the axis; and
   wherein the optical collimation lens collects light extracted from the annular ring along the axis;
   further including a mirror positioned between the optical collimation lens and the annular ring dielectric along the axis and an optical path of light received by the optical collimation lens, the mirror positioned to divert the optical path from the flow of hot gases along the axis.

12. The modular plasma source of claim 11 wherein the mirror is an ultraviolet enhanced aluminum parabolic mirror.

* * * * *